(12) United States Patent
Shiraishi et al.

(10) Patent No.: US 7,166,480 B2
(45) Date of Patent: Jan. 23, 2007

(54) PARTICLE CONTROL DEVICE AND PARTICLE CONTROL METHOD FOR VACUUM PROCESSING APPARATUS

(75) Inventors: Daisuke Shiraishi, Kudamatsu (JP); Akira Kagoshima, Kudamatsu (JP); Hideyuki Yamamoto, Kudamatsu (JP); Takeshi Arai, Yokohama (JP); Hiroyuki Nakano, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/376,274

(22) Filed: Mar. 3, 2003

(65) Prior Publication Data

US 2004/0149208 A1   Aug. 5, 2004

(30) Foreign Application Priority Data

Feb. 4, 2003 (JP) ............................. 2003-027421

(51) Int. Cl.
    *H01L 21/00* (2006.01)
(52) U.S. Cl. ...................... 438/5; 438/11; 257/E21.528
(58) Field of Classification Search ................ 356/336, 356/237.3; 438/5, 11
    See application file for complete search history.

(56) References Cited

U.S. PATENT DOCUMENTS

| | | | | |
|---|---|---|---|---|
| 5,271,264 A | * | 12/1993 | Chanayem | ................ 73/28.01 |
| 5,467,188 A | * | 11/1995 | Miyashita | .................... 356/336 |
| 5,870,189 A | * | 2/1999 | Uesugi et al. | .............. 356/335 |
| 5,940,175 A | * | 8/1999 | Sun | ......................... 356/237.3 |
| 5,943,130 A | * | 8/1999 | Bonin et al. | ................. 356/336 |
| 6,011,622 A | * | 1/2000 | Fishkin et al. | .............. 356/339 |
| 6,125,789 A | * | 10/2000 | Gupta et al. | ............. 118/723 E |
| 2002/0062701 A1 | * | 5/2002 | Guldi et al. | ............. 73/863.23 |

OTHER PUBLICATIONS

John McAndrew, "Progress in In Situ Contamination Control" May 1, 1998, Semiconductor International Magazine. http://www.reed-electronics.com/semiocndutcor/index.asp.*

John F. O'Hanlon, "A User's Guid to Vacuum Technology", John Wiley & Sons, 1980, pp. 73-101.*

Yawar Khawaja et al., "Implementation Of An In-Situ Monitoring Methodology In A Production Environment", IEEE 1996 SEMI Advanced Semiconductor Manufacturing Conference, pp. 281-291.*

* cited by examiner

*Primary Examiner*—W. David Coleman
(74) *Attorney, Agent, or Firm*—Antonelli, Terry, Stout and Kraus, LLP.

(57) ABSTRACT

A particle control device and a particle control method are capable of controlling the occurrences of particles in a vacuum reactor. The particle control device is used in a vacuum processing apparatus having a vacuum reactor, a gas delivery unit for supplying processing gases to the vacuum reactor, and a sample table for supporting a sample in the vacuum reactor, wherein the apparatus subjects the sample to vacuum processing. The particle control device detects particles floating inside the vacuum reactor; generates apparatus condition data indicating a condition of the vacuum processing apparatus; and determines a component which is high in a particle occurrence probability based on detected particle data and apparatus condition data, thereby enabling display of the component selected as the particle source.

14 Claims, 9 Drawing Sheets

| PARTICLE OCCURRENCE STATE — 30 | | | |
|---|---|---|---|
| DATE AND TIME | 2002/12/20 10:15:00 | | — 31 |
| NUMBER OF PARTICLES | ~0.2 [μm] | 7 | — 32 |
| | 0.2~0.5 [μm] | 3 | — 33 |
| | 0.5~1.0 [μm] | 10 | — 34 |
| | 1.0~ [μm] | 25 | — 35 |
| | TOTAL | 45 | — 36 |
| APPARATUS CONDITION | VALVE 7 WAS CLOSED | | — 37 |

| PARTICLE SOURCE PROBABILITY — 40 | 42 | 43 |
|---|---|---|
| PARTICLE SOURCE | PARTICLE SOURCE PROBABILITY (%) | COUNTERMEASURE |
| VALVE 7 | 50% | CLEAN VALVE 7 |
| COMPONENT A | 20% | PLASMA CLEANING (1) |
| COMPONENT B | 15% | CLEAN COMPONENT B |
| VALVE 4 | 5% | CHANGE VALVE 4 |
| COMPONENT C | 2% | PLASMA CLEANING (2) |
| COMPONENT D | 2% | SEQUENCE 1 |
| COMPONENT E | 2% | SEQUENCE 2 |

(41)

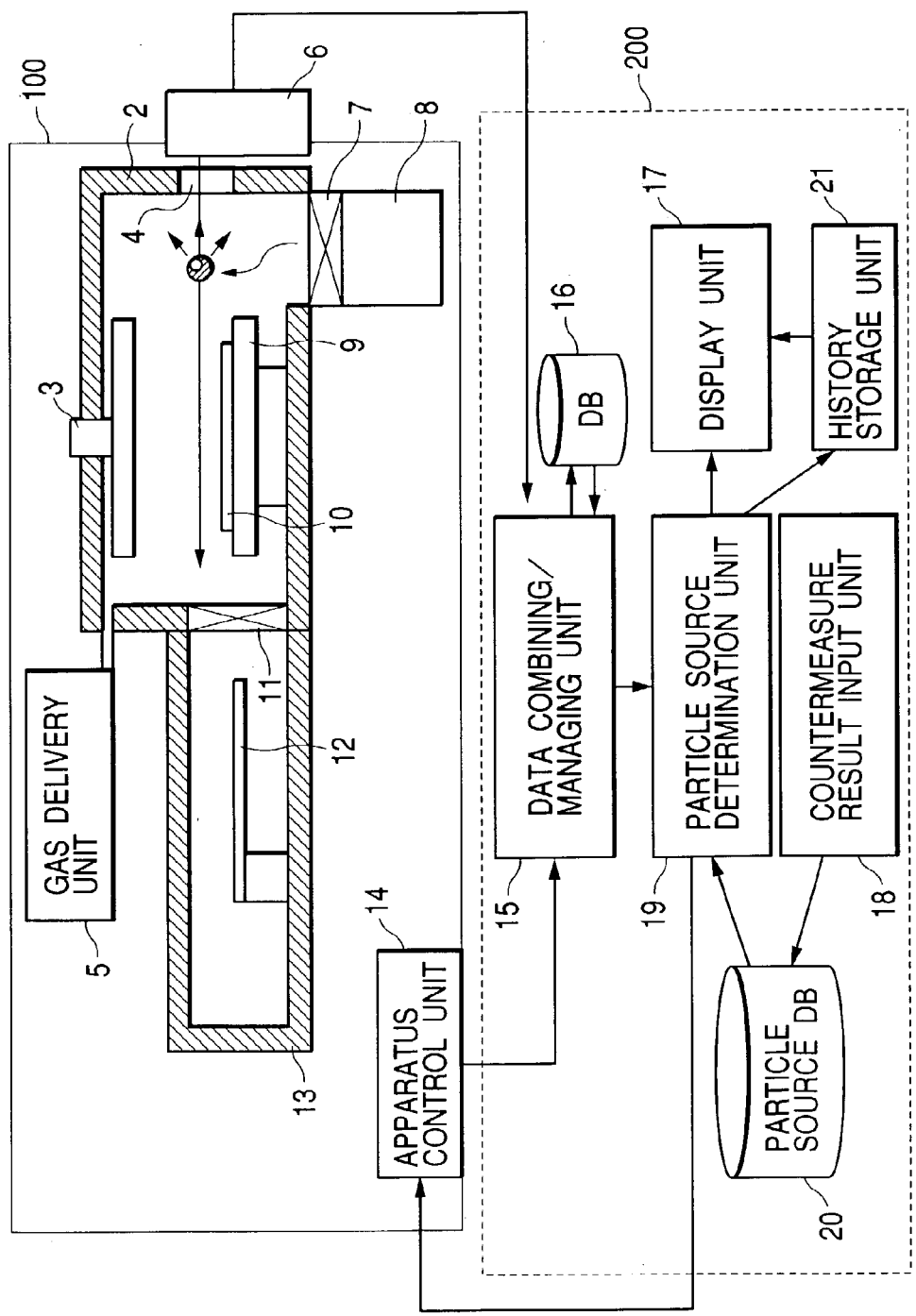

FIG. 2

| APPARATUS CONDITION | | ... | NUMBER AND SIZE OF PARTICLES | | ... | PARTICLE SOURCE AND PROBABILITY | | ... | COUNTERMEASURE | | ... |
|---|---|---|---|---|---|---|---|---|---|---|---|
| APPARATUS CONDITION 1 | APPARATUS CONDITION 2 | ... | ~0.2 μm | 0.2~0.5 μm | ... | PARTICLE SOURCE AND PROBABILITY 1 | PARTICLE SOURCE AND PROBABILITY 2 | ... | COUNTER-MEASURE 1 | COUNTER-MEASURE 2 | ... |
| VALVE 7 WAS OPENED | SAMPLE TABLE 9 WAS ACTUATED | | 20 | 10 | | VALVE 7 : 50% | SAMPLE TABLE 9 : 30% | | CLEAN VALVE 7 | CLEAN SAMPLE TABLE 9 | |
| DURING DELIVERY OF GASES | ACCUMULATED PROCESSING TIME <10 HOURS | | 50 | 30 | | INNER WALLS OF VACUUM REACTOR 2 : 70% | GAS DELIVERY UNIT 5 : 20% | | PLASMA CLEANING | | |
| ... | ... | | ... | ... | | ... | ... | | ... | ... | |

⎧──────── SEARCH KEYS ────────⎫  ⎧──────── OUTPUT VALUES ────────⎫

FIG. 3

| PARTICLE OCCURRENCE STATE — 30 | | |
|---|---|---|
| DATE AND TIME | 2002/12/20 10:15:00 | |
| NUMBER OF PARTICLES | ~0.2 [μm] | 7 | 
| | 0.2~0.5 [μm] | 3 |
| | 0.5~1.0 [μm] | 10 |
| | 1.0~ [μm] | 25 |
| | TOTAL | 45 |
| APPARATUS CONDITION | VALVE 7 WAS CLOSED | |

PARTICLE SOURCE PROBABILITY — 40

| PARTICLE SOURCE | PARTICLE SOURCE PROBABILITY (%) | COUNTERMEASURE |
|---|---|---|
| VALVE 7 | 50% | CLEAN VALVE 7 |
| COMPONENT A | 20% | PLASMA CLEANING (1) |
| COMPONENT B | 15% | CLEAN COMPONENT B |
| VALVE 4 | 5% | CHANGE VALVE 4 |
| COMPONENT C | 2% | PLASMA CLEANING (2) |
| COMPONENT D | 2% | SEQUENCE 1 |
| COMPONENT E | 2% | SEQUENCE 2 |

41  42  43

31 32 33 34 35 36 37

PARTICLE CONTROL DEVICE AND PARTICLE CONTROL METHOD FOR VACUUM PROCESSING APPARATUS

BACKGROUND OF THE INVENTION

The present invention relates to a particle control device and a particle control method for use in a vacuum processing apparatus; and, more particularly, the invention relates to a particle control device and a particle control method for a vacuum processing apparatus that is capable of monitoring and controlling the occurrence of particles in a vacuum processing apparatus.

A vacuum processing apparatus, such as a plasma etching apparatus, generates plasma in a vacuum reactor in a state where the vacuum reactor is charged with etching gases. A predetermined semiconductor circuit is formed by causing radicals and ions, that are generated in the plasma, to react with a wafer surface to be etched. In such a plasma etching apparatus, reaction products, which are generated in the etching process, are deposited on the inner walls and electrodes of the vacuum reactor. The deposited reaction products tend to strip off from the inner walls and the electrodes after a certain period of time and to float as particles inside the vacuum reactor.

Further, the plasma etching apparatus is provided with many mechanical components that serve as particle sources, such as a robot for carrying wafers to or from the vacuum reactor and valves provided on wafer transferring passages.

Particles which are produced from such components and float inside the vacuum reactor adhere on the wafer surface during the etching process and the like, or they fall on the wafer surface when the plasma discharge is terminated, after the completion of the etching process. The particles which have adhered or fallen on the wafer surface cause imperfect etching and produce failures in subsequent processes, ultimately leading to a decreased yield or reduced reliability of the semiconductor products.

In a typical semiconductor manufacturing line, apparatus control is conducted in such a manner that a wafer for particle inspection (dummy wafer), or a surface of a product wafer that has been processed, is reviewed periodically by using a particle inspection device to detect the number of particles present on the wafer surface and the particle sizes of the particles. However, this method cannot detect particles during the processing of the product wafer. With the conventional method, therefore, a large number of defective wafers will undesirably be produced until the particles are detected in the next inspection.

Japanese Patent Laid-open No. 2002-57143, for example, discloses a floating particle detector that is capable of real-time detection (in-situ measurement) of particles during the processing of a wafer, which relates to the above-mentioned problem. This device irradiates the inner walls of a vacuum reactor in a semiconductor manufacturing apparatus with laser light, which is emitted from a laser light source, and detects the laser light which is scattered from particles therein, using an optical system for scattered light detection, thereby detecting the particles floating inside the vacuum reactor.

Also, Japanese Patent Laid-open No. 6-201600 discloses a particle measurement system that is capable of measuring particles floating inside a vacuum reactor, in synchronization with the processing of the wafers, one by one, during the processing of one lot of wafers, and of displaying on a display unit or printing out the particle measurement result.

Although the floating particle detector disclosed in Japanese Patent Laid-open No. 2002-57143 is capable of detecting the presence of particles in the semiconductor manufacturing apparatus, it has difficulty in determining the particle sources. Further, according to the system disclosed in Japanese Patent laid-open No. 6-201600, it is possible to detect on which wafer, in the one lot, the particles are present; however, this system also has difficulty in determining the particle sources. That is to say, although it is possible with the conventional techniques to detect the presence of particles and when the particles appear, they have difficulty in determining the particle sources. If the particle sources are not specified, it is difficult to determine what countermeasure to take, and it is impossible to provide a drastic solution to the occurrence of particles in the apparatus.

If particles are present in the apparatus, the vacuum reactor is usually opened to the air and cleaned by using water or an organic solvent. However, since such treatment is typically performed without knowing the cause of the occurrence of the particles, the particles will appear again soon after the cleaning in many cases. Further, since it takes a considerably long period of time to effect cleaning of the vacuum reactor, the operation rate of the vacuum reactor is decreased, resulting in a reduction in the productivity of the manufacturing line.

SUMMARY OF THE INVENTION

The present invention has been made in view of the above-described problems. The invention provides a particle control device and a particle control method that is capable of controlling the occurrence of particles in a vacuum processing apparatus.

The present invention employs the following means in order to solve the afore-mentioned problems.

According to an aspect of the present invention, there is provided a particle control device for use in a vacuum processing apparatus having a vacuum reactor, a gas delivery means for supplying processing gases to the vacuum reactor, and a sample table for placing and supporting a sample in the vacuum reactor, wherein the sample is subjected to vacuum processing in the apparatus. The particle control device includes a particle monitor for detecting particles floating inside the vacuum reactor; means for generating apparatus condition data indicating a condition of the vacuum processing apparatus; and data managing means for determining a component of the vacuum processing apparatus which has a high particle occurrence probability on the basis of particle data detected by the particle monitor and the apparatus condition data, thereby enabling the display of a component that has been determined to be a particle source.

BRIEF DESCRIPTION OF THE DRAWINGS

Other objects and advantages of the invention will become apparent from the following description of various embodiments, with reference to the accompanying drawings in which:

FIG. 1 is a diagram illustrating a particle control device according to a first embodiment of the present invention;

FIG. 2 is a diagram showing an example of the data structure of a particle source database;

FIG. 3 is a diagram showing an example of display images to be displayed on a display unit;

DETAILED DESCRIPTION OF THE PREFERRED EMBODIMENTS

Figure 4:
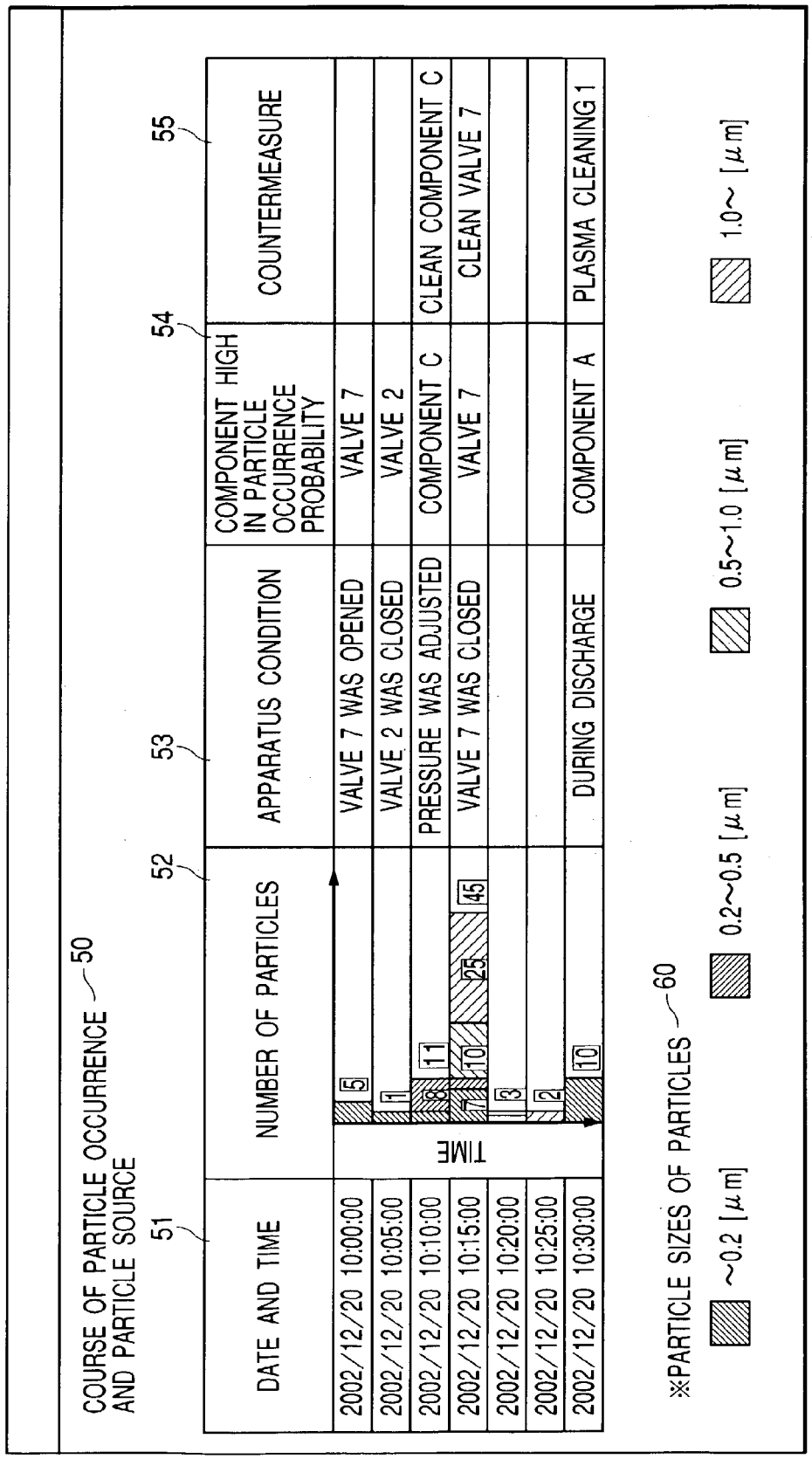
FIG. 4 is a diagram showing another example of the display images to be displayed on a display unit.

Various embodiments of the present invention will be described with reference to accompanying drawings.

FIG. 1 is a diagram illustrating a particle control device according to a first embodiment of the present invention. As shown in FIG. 1, a vacuum processing apparatus 100, such as a plasma etching apparatus, includes a vacuum reactor 2 and a plasma generation unit 3 having an antenna electrode and a coaxial line for supplying high frequency power to the antenna electrode (not shown).

A particle measurement window 4 is provided on a wall of the vacuum reactor 2. A gas delivery unit 5 supplies processing gases to the vacuum reactor 2. A particle monitor 6 emits laser light to the interior of the vacuum reactor 2 through the window 4 and detects laser light which is scattered by the particles in the vacuum reactor 2, to thereby detect the size (particle size) of floating particles and the number of particles present in the vacuum reactor 2. The detected values are outputted as particle data.

A gas exhaust unit 8 exhausts the gases from the vacuum reactor 2 to maintain a gas pressure in the vacuum reactor 2 at a predetermined value. A sample table 9 is used for supporting a sample 10, such as a wafer, in a processing region of the vacuum reactor 2. A gate valve 11 is used for partitioning the vacuum reactor 2 from a buffer chamber 13, which is adapted to open when a transfer robot 12 accesses a sample in the vacuum reactor 2. The robot 12 carries the sample 10 to be etched to or from the sample table 9. The buffer chamber 13 is used when the sample is carried into or from the vacuum reactor.

An apparatus control unit 14 generates process control signals for controlling the plasma etching apparatus in accordance with a recipe and monitors the state of control. Further, the apparatus control unit 14 generates and outputs apparatus condition data which indicate conditions of the vacuum reactor (e.g., open/closed condition of a valve, gas flow rate, sample transfer position, gas pressure, bias potential, time elapsed from the preceding reactor cleaning, accumulated time of sample processing, contents of sample processing, etc.) based on the control signals or the monitoring result.

A data managing unit 200 determines a component of the apparatus which has a high particle occurrence probability based on the particle data generated by the particle monitor 6 and the apparatus condition data generated by the apparatus control unit 14, or on the basis of the particle occurrence timing. The identity of the component that has been determined is displayed on a display unit 17. A data combining/managing unit 15 combines a time series of the particle data with a time series of the apparatus condition data to generate another series of data. A data storage unit 16 stores the combined data, the particle data and the apparatus condition data, together with data indicating the time and date of the particle occurrence. A particle source determination unit 19 determines, based on the combined data, a component which has a high particle occurrence probability, with reference to a particle source database 20. The particle source database 20 stores the apparatus condition data, particle source data indicating a probable particle source from which the particles are likely to be produced when the vacuum reactor is in a condition corresponding to the apparatus condition data, and particle occurrence probability data of the particle source. The particle occurrence probability data may be prepared on the basis of data of past results of countermeasures taken against the generation of particles, the experience of operators of the vacuum reactor, or the like. Even if the apparatus condition data does not change, the particle occurrence probability data may preferably be recorded every time the number of particles and the particle size distribution change, while a particle source relevant to the changes is determined.

The display unit 17 displays information concerning a plurality of particle sources, for example, which are determined by the particle source determination unit 19, with the occurrence probability being appended to each designation of the particle sources. It is possible to display countermeasures for the respective particle sources, as well. A countermeasure result input unit 18 is used by the operator of the vacuum reactor for inputting a result of the countermeasure which has been taken in accordance with a displayed countermeasure. A history storage unit 21 stores information concerning the particle sources which are determined by the particle source determination unit 19, the occurrence probabilities of the respective particle sources, the countermeasures taken, countermeasure results, and so forth. In addition, it is possible to store the combined data in the history storage unit 21.

The combined data, which has been generated by combining the time series of particle data and the time series of apparatus condition data, is outputted to the particle source determination unit 19 and stored simultaneously in the data storage unit 16. The combined data includes the particle occurrence date and time data and the apparatus condition data, which exists at the date and time of the particle occurrence.

The particle source determination unit 19 receives the combined data and searches the particle source database 20, based on the received combined data, using a search key, which will be described later in this specification. For example, every time particles occur, the particle source determination unit 19 searches the particle source database 20, using the number of particles per particle size and the reactor condition as the search keys, to determine a plurality of components which have a high likelihood of being the particle source and to determine the occurrence probabilities of the likelihood. The determined data is displayed on the display unit 17. Further, if the particle source determination unit 19 searches the particle source database 20, the identification of countermeasures to be taken against the particle occurrences can be displayed on the display unit 17.

FIG. 2 is a diagram showing an example of the data structure of the particle source database 20. As shown in FIG. 2, the particle source database 20 includes search keys and output values. In a search of the database 20, the apparatus condition data and the particle data, or either one of them, are assigned as the search key. The output values may consist of the particle source data and the occurrence probability data of the particle source, the countermeasure data or a part of these data.

Depending on the countermeasure identified as a result of the search, the particle source determination unit 19 can send signals for performing vacuum reactor control in accordance with the identified countermeasure to the apparatus control unit 14 immediately after the search. For example, if it has been judged that the particle source consisted of a minor deposition on the inner walls of the vacuum reactor 2, the particle source determination unit 19 may instruct the apparatus control unit 14 to perform plasma cleaning automatically before the subsequent wafer processing.

The combined data, including the particle data and the apparatus condition data, as well as the countermeasure history, are stored in the history storage unit 21. This makes it possible to refer to past situations immediately, when so required. Further, after a countermeasure is taken, the countermeasure result input unit 18 registers a result of the countermeasure in the particle source database 20. Thus, it is possible to improve the accuracy of the particle source database 20.

FIG. 3 is a diagram showing an example of display images to be displayed on the display unit 17, in which a particle occurrence state and a particle occurrence source probability are shown. In FIG. 3, a particle occurrence state display section 30 has an occurrence date and time entry 31, number of particles per particle size entries 32 to 35, a total number of particles entry 36, and a reactor condition at particle occurrence entry 37.

The example shown in FIG. 3 indicates that particles were produced when the valve 7 was closed, and the total number of the particles was 45, which included 7 particles each having a particle size of 0.2 μm or less, 3 particles each having a particle size of 0.2 to 0.5 μm, 10 particles each having a particle size of 0.5 to 1.0 μm, and 25 particles each having a particle size of 1.0 μm or more.

A display section 40 indicates a particle source probability, wherein components which are estimated to be sources of the particles, which are displayed on the particle occurrence state display section 30, are displayed as particle sources in a particle source column 41. Also, the probabilities of being true particle source of the respective particle sources are displayed in a column 42 as a particle source probability. Further, the identifications of countermeasures for use on the respective particle sources are displayed in a countermeasure column 43.

The particle sources and the countermeasures are displayed as described above. This permits the operator which is performing the vacuum reactor control to judge instantly what countermeasure is to be taken against a particle occurrence. Further, if the situation is not improved by the countermeasure, the operator can recognize and initiate a second nominated countermeasure. Therefore, it is possible to reduce, to a large extent, shut-down periods of the apparatus caused by the particle occurrence.

In the example shown in FIG. 3, the combinations of the particle sources and the probabilities are such that the valve 7 has a probability of 50%, the component A has a probability of 20%, the component B has a probability of 15%, the valve 4 has a probability of 5%, the component C has a probability of 2%, the component 0 has a probability of 2%, and the component E has a probability of 2%. Therefore, the operator first performs cleaning of the valve 7, which is the countermeasure for the component having the highest probability. If no improvement is attained by this cleaning, the component A, which has the second highest probability, is subjected to plasma cleaning (1).

FIG. 4 is a diagram showing another example of display images to be displayed on the display unit 17. In the example, a display section 50 representing the course of particle occurrence and the particle source has a particle occurrence date and time column 51, a number of particles column 52, a reactor condition column 53, a particle source having the highest probability column 54, and a countermeasure column 55. In the number of particles column 52, the numbers of particles per particle size are displayed by using different display patterns or display colors for respective particle sizes, which are indicated and defined in a particle size legend display section 60.

The particle source determination unit 19 judges whether or not a countermeasure should be taken by the operator based on the numbers of particles (numbers of particles per particle size) and the reactor condition. The particle source determination unit 19 displays no countermeasure if it is judged that no countermeasure is necessary, or one or more countermeasures are displayed in the countermeasure column 55 only when it is judged that the countermeasure or countermeasures is/are necessary.

Figure 5:
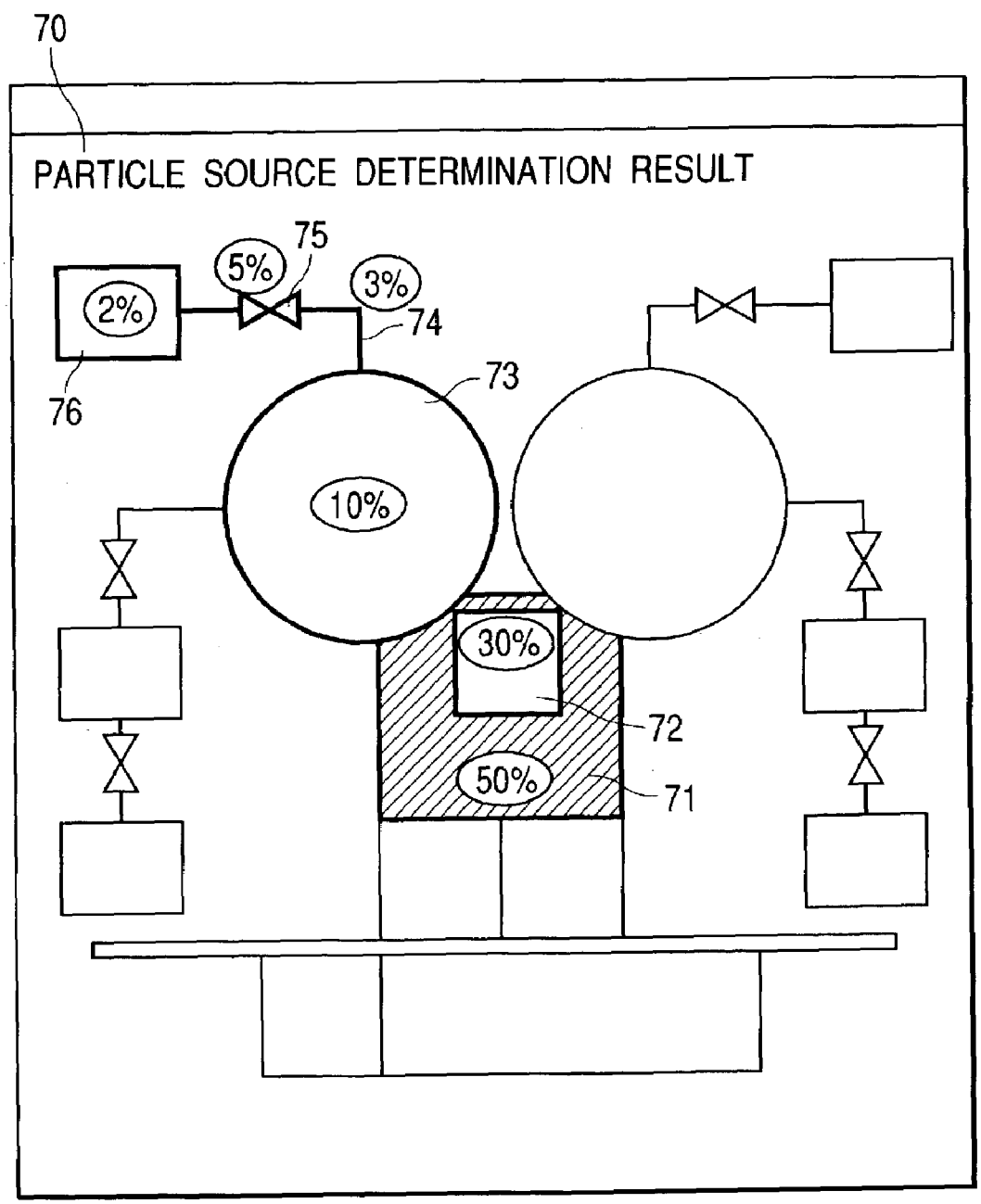
FIG. 5 is a diagram showing another example of the display images to be displayed on a display unit.

FIG. 5 is a diagram showing another example of display images to be displayed on the display unit 17. In the example, a result of determined particle sources is displayed. A particle source determination result display section 70 graphically indicates components which will be determined as the particle sources.

The particle source determination unit 19 searches the particle source database 20, based on the received merged data, to identify a plurality of components which have a high likelihood of being a particle source, as well as the occurrence probabilities of the likelihood. The determination result is graphically displayed on the particle source determination result display section 70.

In the example of FIG. 5, the identified components of the particle source determination result are displayed in different display patterns or display colors. The probabilities (of likelihood) of being a particle source may be displayed together with the particle source determination result. For example, if the component 71 has a 50% probability of being a particle source, the component 71 is displayed together with the probability, with the display pattern or the display color thereof being varied from that of other components for emphasis. Further, each of the components 72 to 76 is displayed together with its probability in the same emphasized display fashion. In addition, a countermeasure or countermeasures may be displayed only when the operator has to take countermeasure(s).

Figure 6:
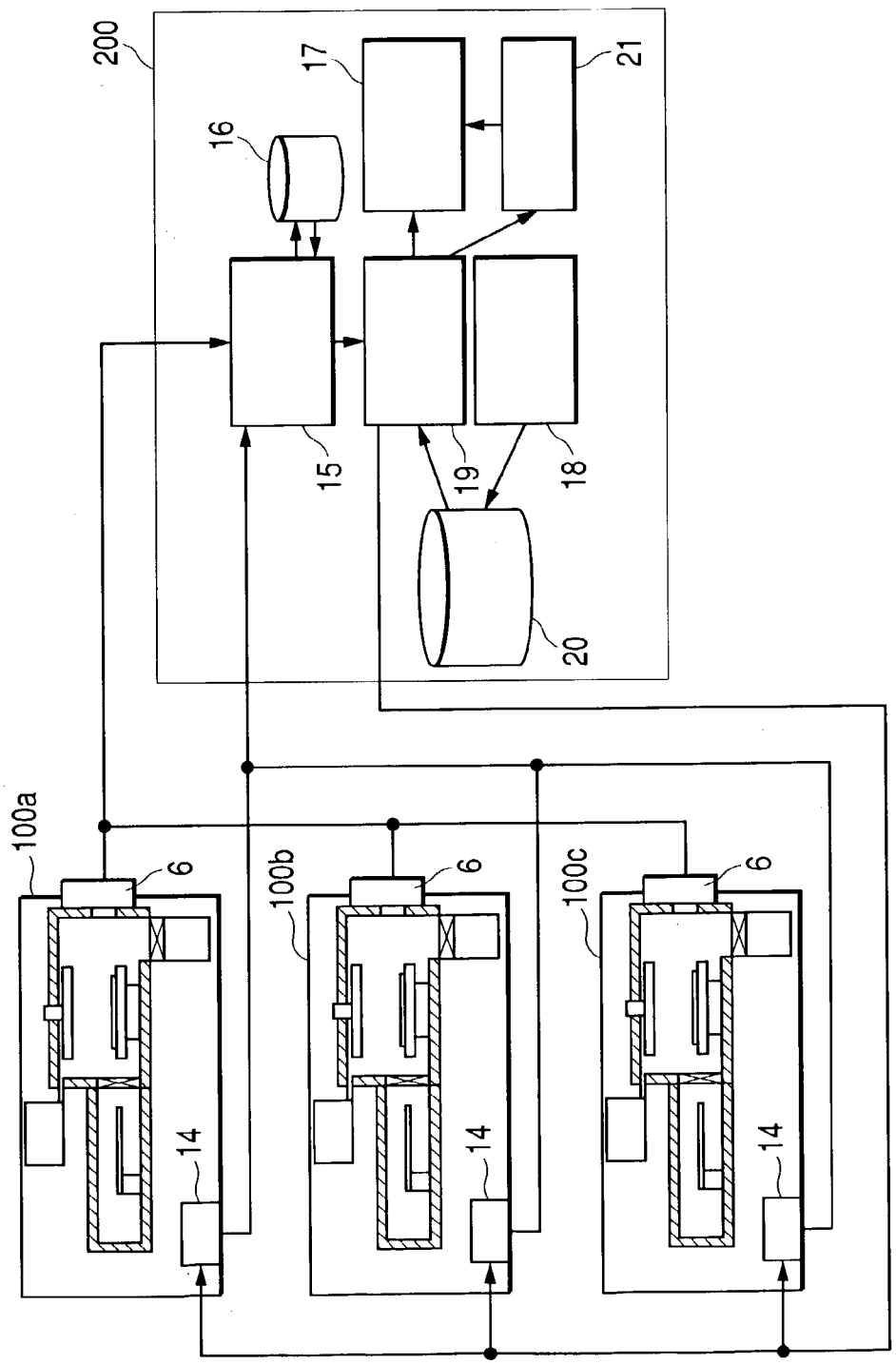
FIG. 6 is a diagram illustrating a second embodiment of the present invention.
Figure 8:
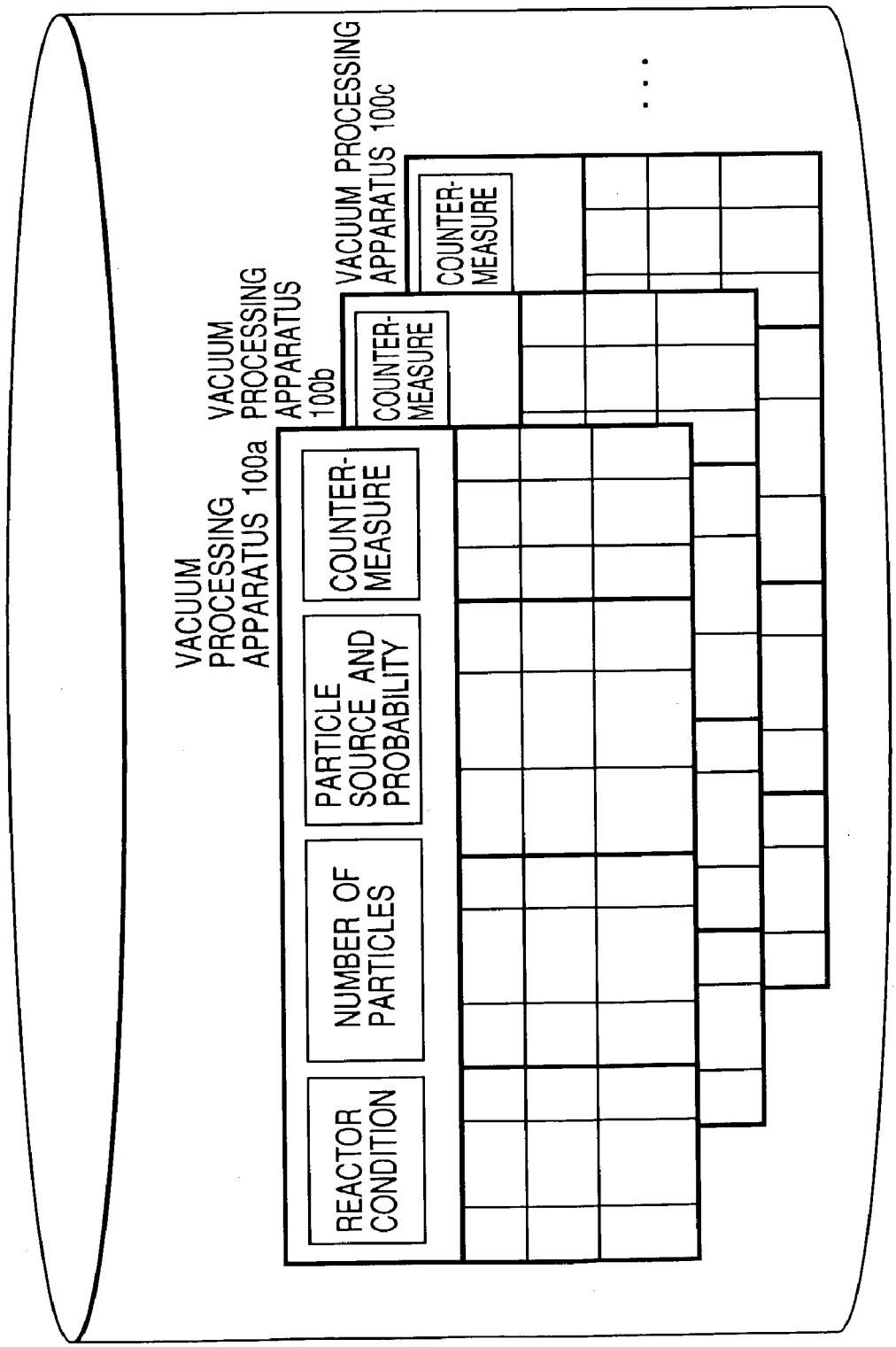
FIG. 8 is a diagram illustrating an example of the structure of the particle source database.

FIG. 6 is a diagram illustrating a second embodiment of the present invention. In FIG. 6, vacuum processing apparatuses 100a, 100b and 100c are controlled by a data managing unit 200. Each of the vacuum processing apparatuses 100a, 100b and 100c has a particle monitors 6 and an apparatus control units 14. The data managing unit 200 receives particle data and apparatus condition data from the particle monitor 6 and the apparatus control unit 14 as combined data. In the same manner as in the first embodiment, the data managing unit 200 searches a particle source database 20 using a search key, that is generated on the basis of the received combined data, to provide a search result. The particle source database 20 may preferably be provided with a section for each of the vacuum processing apparatuses 100a, 100b and 100c, so that the search and search result for each of the vacuum processing apparatuses 100a, 100b and 100c, are displayed as shown in FIG. 8.

Figure 7:
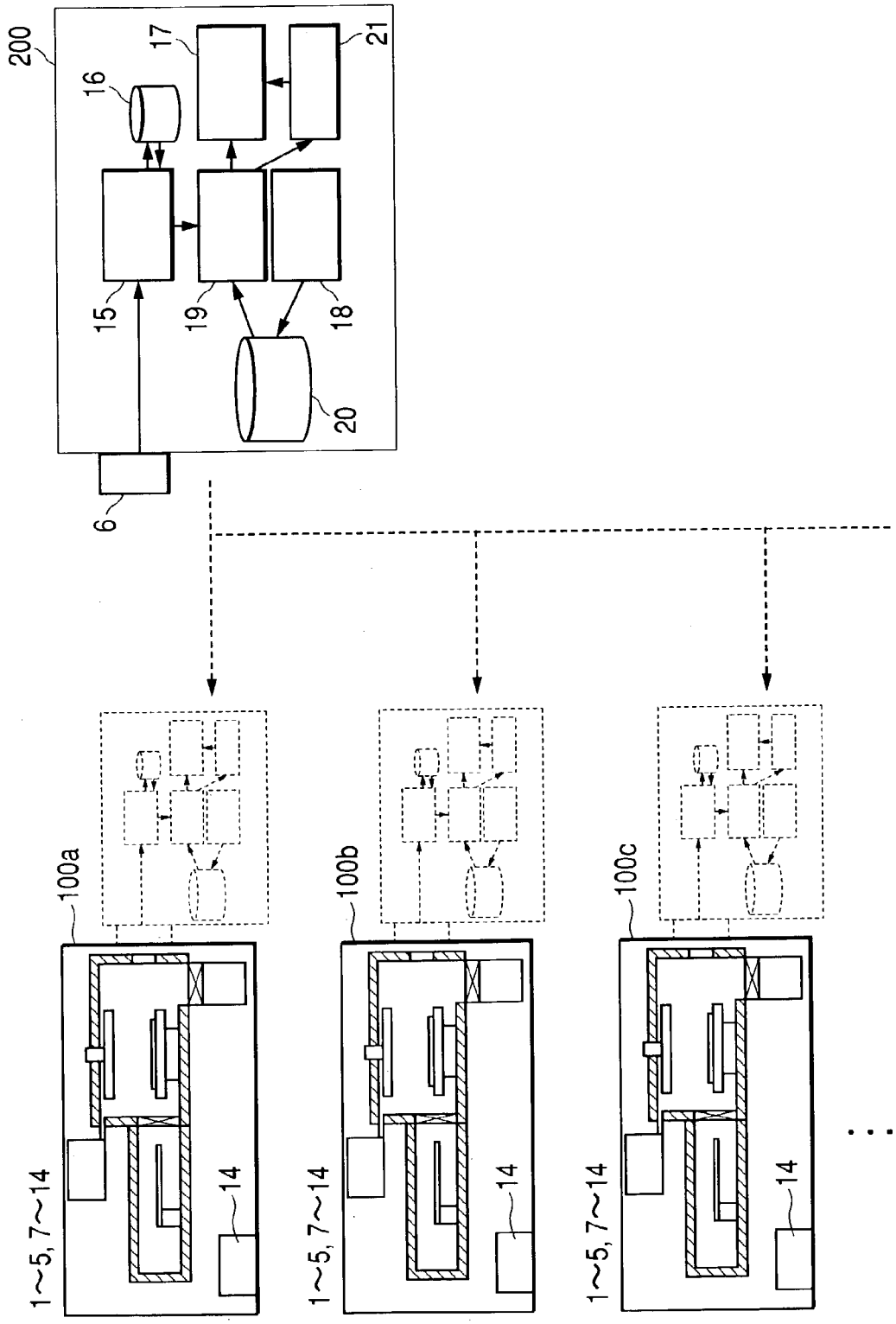
FIG. 7 is a diagram illustrating a third embodiment of the present invention.

FIG. 7 is a diagram illustrating a third embodiment of the present invention. In FIG. 7, vacuum processing apparatuses 100a, 100b and 100c are controlled by a data managing unit 200. In the present embodiment, the data managing unit 200 is a portable unit. In actual use, the operator carries the data managing unit 200 to a location where the vacuum processing apparatuses 100a, 100b and 100c, which should undergo particle control, are installed, and the operator attaches it selectively to any one of the vacuum processing apparatuses 100a, 100b and 100c, as shown in dashed line in FIG. 7.

In this case, too, the data managing unit 200 searches a particle source database 20, using a search key that is generated on the basis of the received combined data, to provide a search result. The particle source database 20 may preferably be provided with a section for each of the vacuum processing apparatuses 100a, 100b and 100c, so that the search and search result for each of the vacuum processing apparatuses 100a, 100b and 100c can be displayed as shown in FIG. 8.

Figure 9:
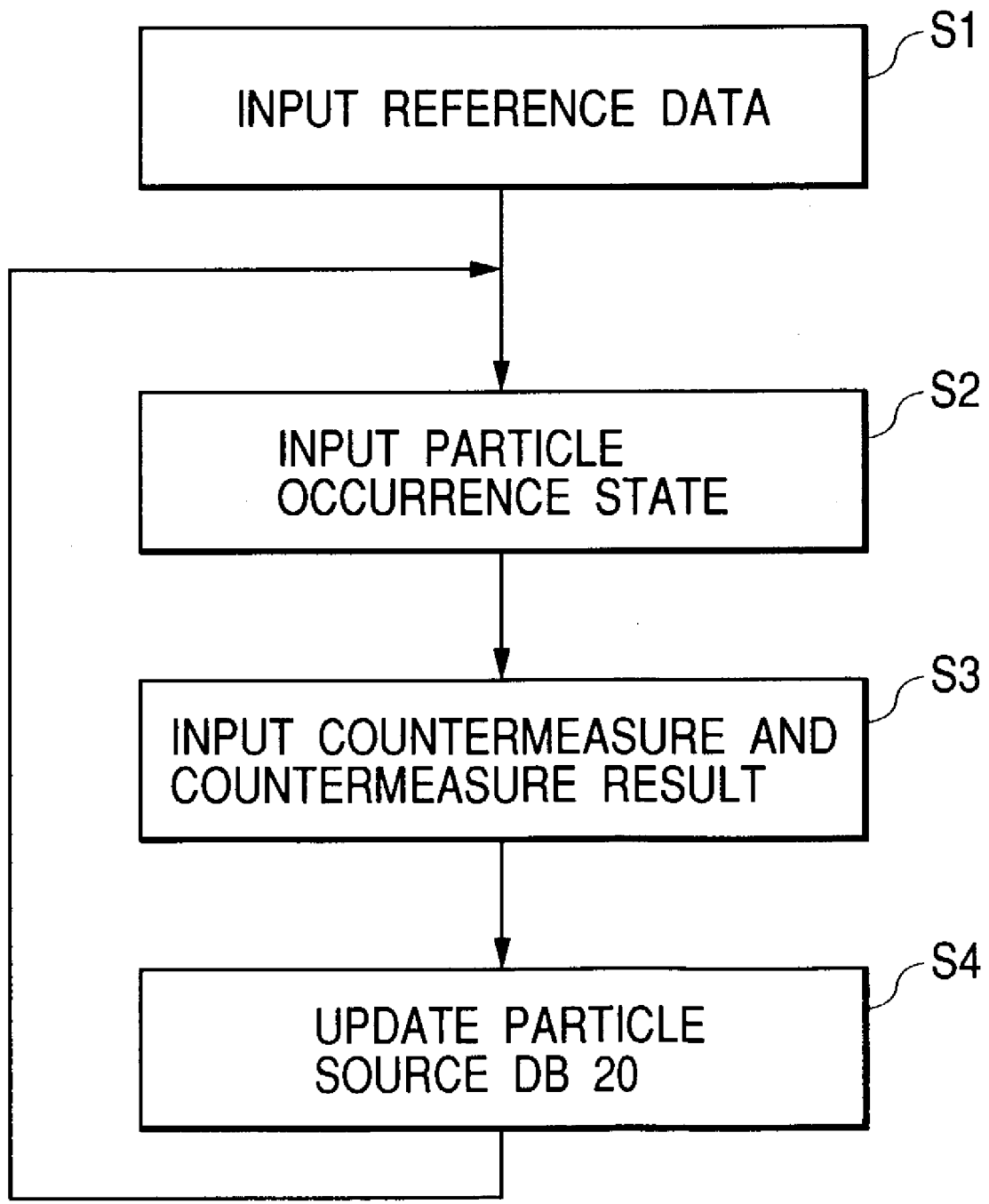
FIG. 9 is a flowchart illustrating a process of updating the particle source database.

FIG. 9 is a flowchart showing a process for updating the particle source database 20. First of all, reference data are inputted to the particle source database 20 as initial values. The reference data to be inputted include apparatus condition data, particle data, particle source data, probability data, countermeasure data and so forth. The particle source data, the probability data, and the countermeasure data are estimated from the apparatus condition data or the particle data, based on the experience of the operator, before the reference data is inputted (Step 1).

Next, a particle occurrence state showing that a particle has actually occurred somewhere, is inputted. The contents to be inputted include at least one of the apparatus condition data and the particle data. In inputting the data, it is possible to employ either a method of selecting the data from the combined data outputted from the data combining/managing unit 15 or a means for inputting the data using the countermeasure result input unit 18 (Step 2).

Next, a countermeasure which was actually taken against the particle occurrence and a result of the countermeasure are inputted. For example, the countermeasures may include data on cleaning of a valve 11, plasma cleaning or the like. For the countermeasure result, "OK" is inputted if the particles no longer occur as a result of the countermeasure, and "NG" is inputted if the particles have continued to occur even after taking the countermeasure. In addition, if the particle occurrence was improved to a certain extent, "50% OK" or the like may be inputted (Step 3).

Then, the particle source database 20 is updated on the basis of these inputs. If "OK" is inputted for the result of the specific countermeasure, the probability of the part associated with the countermeasure being the particle source is increased. If "NG" is inputted for the result of the countermeasure, the probability of the part associated with the countermeasure being the particle source is decreased (Step 4).

In this way, repetitive execution of steps 2 through 4 provides an improvement in the accuracy of the particle source database 20.

Another example of the process for determining a particle source (process of determining a particle source by deliberately operating a component to generate particles) will hereinafter be described. First of all, the vacuum processing apparatus 100 is operated in a state where no product wafer is placed in the vacuum reactor 2. For example, a part or all of the components constituting the vacuum processing apparatus 100 is/are operated, one by one or in combination. For instance, the following series of operations may be performed: lowering the sample table 9 simultaneously with the opening of the valve 11, introducing the robot 12 to the vacuum reactor 2, returning the robot 12 to the buffer chamber 13, closing the valve 11, opening the valve 7, and supplying gases from the gas delivery unit 5 to the vacuum reactor 2.

After the completion of the above-described series of operations, the operator refers to data, such as data displayed on the display unit 17. As an example, it may turn out that the particle monitor 6 has detected the occurrence of more than 30 particles, each having a particle size of 1.0 µm or more, when the robot 12 was introduced into the vacuum reactor 2. Also, it may turn out that the particle source determination unit 19 determines that the probabilities of the robot 12 and the buffer chamber 13 being particle sources are 60% and 40%, respectively, and, thereby, that countermeasures involving cleaning the robot 12 and the buffer chamber 13 are required. In this case, the operator cleans the robot 12 and the buffer chamber 13 in accordance with the designated countermeasures to prevent the occurrence of particles.

According to the above-described embodiments, a component having a high particle occurrence probability is determined and its identity is displayed, based on particle data generated by a particle monitor and apparatus condition data generated by an apparatus control unit. Also, in displaying an identified component, the particle occurrence source and a plurality of candidates of countermeasures to be performed therefor are displayed together with the probability. Thus, it is possible to shorten the time required for identifying a particle source and to shorten the time required for restoring the vacuum reactor to a normal operating condition. As a result, it is possible to improve the actual operation rate of the apparatus.

Further, since the particle source database is corrected and updated; based on data concerning particle sources which are actually detected, it is possible to increase the accuracy in identifying the particle sources and the countermeasures to be applied for the particle sources. Also, it is possible to determine components and sequence processes which are prone to promote particle occurrence. Thus, it is possible to effectively improve the hardware and software of the apparatus based on the determination result.

It is possible to facilitate the operator's monitoring by providing a display unit with a printing unit, for example, and printing out the displayed items.

In the foregoing description, a vacuum processing apparatus of the type used for manufacturing semiconductors has been considered as an example of a plasma etching apparatus; however, the present invention is applicable to apparatuses other than semiconductor manufacturing apparatuses, such as apparatus for in the fabrication of liquid crystal display devices and magnetic heads.

According to the present invention, as described above, it is possible to provide a particle control device and a particle control method that are capable of controlling the occurrence of particles in a vacuum processing apparatus.

While the invention has been described with reference to various preferred embodiments, it is to be understood that the words which have been used are words of description rather than limitation, and that changes within the purview of the appended claims may be made without departing from the true scope and spirit of the invention.

What is claimed is:

1. A particle control device for a plasma etching vacuum processing apparatus having a vacuum reactor, a gas delivery means for supplying process gases to the vacuum reactor, and a sample table for placing and supporting a sample in the vacuum reactor, wherein the plasma etching vacuum processing apparatus subjects the sample to plasma etching vacuum processing thereby generating reaction products including particles which float in the vacuum reactor, the particle control device comprising:

a particle monitor for detecting the particles floating inside the vacuum reactor;

means for generating apparatus condition data indicating a condition of the plasma etching vacuum processing apparatus; and data managing means for estimating different components of the plasma etching vacuum processing apparatus which contribute to generation of the detected floating particles inside the vacuum reactor on the basis of particle data detected by the particle monitor and the condition data, and for ranking a probability of the different components as a source of the generation of the detected particles.

2. A particle control device for a plasma etching vacuum processing apparatus having a vacuum reactor, a gas delivery means for supplying process gases to the vacuum reactor, and a sample table for placing and supporting a sample in the vacuum reactor, wherein the plasma etching vacuum processing subjects the sample to plasma etching vacuum processing thereby generating reaction products including particles which float in the vacuum reactor, the particle control device comprising:

a particle monitor for detecting, on a real-time basis, the particles floating inside the vacuum reactor;

apparatus control means for generating process control data, based on a recipe, and controlling the plasma etching vacuum processing apparatus using the process control data, and for generating apparatus condition data indicating a condition of the plasma etching vacuum processing apparatus, based on the generated process control data; and data managing means estimating different components of the plasma etching vacuum processing apparatus which contribute to generation of the detected floating particles inside the vacuum reactor on the basis of particle data detected by the particle monitor and the condition data, and for ranking a probability of the different components as a source of the generation of the detected particles.

3. A particle control device for a plasma etching vacuum processing apparatus having a vacuum reactor, a gas delivery means for supplying process gases to the vacuum reactor, and a sample table for placing and supporting a sample in the vacuum reactor, wherein the plasma etching vacuum processing apparatus subjects the sample to plasma etching vacuum processing thereby generating reaction products including particles which float in the vacuum reactor, the particle control device comprising:

a particle monitor for detecting the particles floating inside the vacuum reactor;

apparatus control means for generating process control data, based on a recipe, and controlling the plasma etching vacuum processing apparatus, and for generating apparatus condition data indicating a state of the plasma etching vacuum processing apparatus, based on the generated process control data; and data managing means for estimating different components of the plasma etching vacuum processing apparatus which contribute to generation of the detected floating particles inside the vacuum reactor on the basis of particle data detected by the particle monitor and the condition data, and for ranking a probability of the different components as a source of the generation of the detected particles.

4. The particle control device for the plasma etching vacuum processing apparatus according to any one of claims 1 to 3, wherein the particle monitor detects the size of the particles and the number of the particles as particle data.

5. The particle control device for the plasma etching vacuum processing apparatus according to any one of claims 1 to 3, wherein the plasma etching vacuum processing apparatus comprises a database for storing apparatus condition data indicating a condition of the plasma etching vacuum processing apparatus, data on the different components having a high likelihood of being a particle source in the indicated condition, and data on probabilities of the likelihood, thereby enabling at least one of the different components having a high particle occurrence probability to be determined and displayed based on data in the database.

6. The particle control device for the plasma etching vacuum processing apparatus according to any one of claims 1 to 3, wherein the data managing means comprises a database for storing apparatus condition data indicating a condition of the plasma etching vacuum processing apparatus, data on the different components having high likelihood of being a particle source in the indicated condition, and data on probabilities of the likelihood, and an input means for correcting the database based on actually-detected data of the different components from which the particles have been produced, thereby enabling a at least one of the different components having a high particle occurrence probability to be determined and displayed based on the corrected database.

7. The particle control device for the plasma etching vacuum processing apparatus according to any one of claims 1 to 3, wherein a single data managing means is provided in common for a plurality of plasma etching vacuum processing apparatuses, and the data managing means comprises, for each of the plasma etching vacuum processing apparatuses, a database for storing apparatus condition data indicating a condition of the plasma etching vacuum processing apparatus, data on the different components having a high likelihood of particle occurrence in the indicated condition, and data on probabilities of the likelihood.

8. A particle control method for use in a plasma etching vacuum processing apparatus having a vacuum reactor, a gas delivery means for supplying process gases to the vacuum reactor, and a sample table for placing and supporting a sample in the vacuum reactor, wherein the sample is subjected to plasma etching vacuum processing thereby generating reaction products including particles which float in the vacuum reactor, said method comprising the steps of:

detecting the particles floating inside the vacuum reactor using a particle monitor; and estimating different components of the plasma etching vacuum processing apparatus which contribute to the generation of the detected floating particles on the basis of particle data detected by the particle monitor and apparatus condition data indicating a condition of the plasma etching vacuum processing apparatus and ranking a probability of the different components as a source of the generation of the detected particles.

9. A particle control method for use in a plasma etching vacuum processing apparatus having a vacuum reactor, a gas delivery means for supplying process gases to the vacuum reactor, and a sample table for placing and supporting a sample in the vacuum reactor, wherein the sample is subjected to plasma etching vacuum processing thereby generating reaction products including particles which float in the vacuum reactor, said method comprising the steps of:

detecting, on a real-time basis, the particles floating inside the vacuum reactor using a particle monitor;

controlling the operation of the plasma etching vacuum processing apparatus and generating apparatus condition data during said operation; and estimating different components of the plasma etching vacuum processing apparatus which contribute to the generation of the detected floating particles on the basis of particle data detected by the particle monitor and said apparatus condition data and ranking a probability of the different components as a source of the generation of the detected particles.

10. A particle control method for use in a plasma etching vacuum processing apparatus having a vacuum reactor, a gas delivery means for supplying process gases to the vacuum reactor, and a sample table for placing and supporting a sample in the vacuum reactor, wherein the sample is subjected to plasma etching vacuum processing thereby generating reaction products including particles which float in the vacuum reactor, said method comprising the steps of:

detecting the particles floating inside the vacuum reactor using a particle monitor;

controlling the operation of the plasma etching vacuum processing apparatus and generating apparatus condition data during said operation; and estimating different components of the plasma etching vacuum processing apparatus which contribute to the generation of the detected floating particles, on the basis of particle data detected by the particle monitor, said apparatus condition data obtained when the particle data was detected, and the time when the apparatus condition data was generated and ranking a probability of the different components as a source of the generation of the detected particles.

11. The particle control method for use in a plasma etching vacuum processing apparatus according to any one of claims 8 to 10, wherein the particle monitor detects the size of the particles and the number of the particles as particle data.

12. The particle control method for use in the plasma etching vacuum processing apparatus according to any one of claims 8 to 10, where in the plasma etching vacuum processing apparatus comprises a database for storing apparatus condition data indicating a condition of the plasma etching vacuum processing apparatus, data on the different components having a high likelihood of being a particle source in the indicated condition, and data on probabilities of the likelihood, thereby enabling at least one of the different components having a high particle occurrence probability to be determined and displayed based on the database.

13. The particle control method for use in a plasma etching vacuum processing apparatus according to any one of claims 8 to 10, wherein the plasma etching vacuum processing apparatus further has data managing means including a database for storing apparatus condition data indicating a condition of the plasma etching vacuum processing apparatus, data on the different components having a high likelihood of being a particle source in the indicated condition, and data on probabilities of the likelihood, and wherein the method further comprises:

correcting the database based on actually-detected data of the different components from which the particles have been produced.

14. The particle control method for use in a plasma etching vacuum processing apparatus according to any one of claims 8 to 10, wherein the plasma etching vacuum processing apparatus further has data managing means provided in common for a plurality of plasma etching vacuum processing apparatuses, and the data managing means comprises, for each of the plasma etching vacuum processing apparatuses, a database for storing apparatus condition data indicating a condition of the plasma etching vacuum processing apparatus, data on the different components having a high likelihood of being a particle source in the indicated condition, and data on probabilities of the likelihood, wherein the method further comprises:

transporting the data managing means to the location of the plasma etching vacuum processing apparatus; and coupling the data managing means to the plasma etching vacuum processing apparatus to monitor the operating state thereof.

* * * * *